(12) United States Patent
Li et al.

(10) Patent No.: US 11,396,806 B2
(45) Date of Patent: Jul. 26, 2022

(54) DOWNHOLE SIGNAL COMPRESSION AND SURFACE RECONSTRUCTION

(71) Applicant: Halliburton Energy Services, Inc., Houston, TX (US)

(72) Inventors: Jian Li, Bellaire, TX (US); Bin Dai, Spring, TX (US); Christopher Michael Jones, Katy, TX (US); Etienne Samson, Cypress, TX (US); Ilker R. Capoglu, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 63 days.

(21) Appl. No.: 16/488,846

(22) PCT Filed: Nov. 6, 2018

(86) PCT No.: PCT/US2018/059355
§ 371 (c)(1),
(2) Date: Aug. 26, 2019

(87) PCT Pub. No.: WO2020/096571
PCT Pub. Date: May 14, 2020

(65) Prior Publication Data
US 2021/0062642 A1 Mar. 4, 2021

(51) Int. Cl.
*E21B 47/12* (2012.01)
*E21B 49/08* (2006.01)
*G01V 3/38* (2006.01)

(52) U.S. Cl.
CPC .............. *E21B 47/12* (2013.01); *E21B 49/08* (2013.01); *G01V 3/38* (2013.01)

(58) Field of Classification Search
CPC ........... E21B 47/12; E21B 49/08; G01V 3/38; H03M 7/70; H03M 7/4056; H03M 7/3059
See application file for complete search history.

(56) References Cited

U.S. PATENT DOCUMENTS

| | | |
|---|---|---|
| 6,932,167 B2 | 8/2005 | Proett et al. |
| 7,680,600 B2 | 3/2010 | Carnegie et al. |
| (Continued) | | |

FOREIGN PATENT DOCUMENTS

| | | |
|---|---|---|
| GB | 2456429 A | 3/2010 |
| WO | 2013052423 A2 | 4/2013 |
| (Continued) | | |

OTHER PUBLICATIONS

Elad, et al., "K-SVD: An algorithm for designing overcomplete dictionaries for sparse representation", IEEE Transactions on Signal Processing, vol. 54, No. 11, pp. 4311-4322, Nov. 2006.
(Continued)

*Primary Examiner* — Tarun Sinha
*Assistant Examiner* — Lal C Mang
(74) *Attorney, Agent, or Firm* — Delizio, Peacock, Lewin & Guerra

(57) ABSTRACT

An apparatus includes a subsurface sensor for use in a borehole to provide a subsurface measurement series, a subsurface processor to receive the subsurface measurement series, and a machine-readable medium. The machine-readable medium has program code to cause the apparatus to obtain the subsurface measurement series and generate an atom combination based on the subsurface measurement series using the subsurface processor, wherein the atom combination comprises a subset of atoms from a dictionary. The code also has instructions to generate a set of characterizing values and transmit the set of characterizing values to a different physical location, wherein the set of characterizing values comprises an atom identifier and at least one corresponding atom weight for at least one atom from the atom combination.

20 Claims, 9 Drawing Sheets

(56) References Cited

U.S. PATENT DOCUMENTS

| | | |
|---|---|---|
| 7,805,247 B2 | 9/2010 | Hsu et al. |
| 2003/0103563 A1 | 6/2003 | Amini et al. |
| 2006/0209963 A1 | 9/2006 | Valente |
| 2006/0269055 A1* | 11/2006 | Mullen .................. H04L 9/0637 380/37 |
| 2007/0198192 A1 | 8/2007 | Hsu et al. |
| 2012/0321209 A1 | 12/2012 | Le et al. |
| 2013/0135114 A1 | 5/2013 | Ringer et al. |
| 2013/0214779 A1 | 8/2013 | Tietjen et al. |
| 2014/0037199 A1 | 2/2014 | Aharon et al. |
| 2015/0078625 A1 | 3/2015 | Yu et al. |
| 2016/0012314 A1 | 1/2016 | Ramamurthy et al. |
| 2016/0146959 A1* | 5/2016 | Purves .................. G01V 1/302 |
| 2017/0089195 A1 | 3/2017 | Yu |
| 2017/0114634 A1 | 4/2017 | Yu et al. |
| 2018/0176499 A1* | 6/2018 | Gelman ................ H04N 19/12 |
| 2019/0073748 A1* | 3/2019 | Lu ............................ G06T 5/002 |
| 2021/0032986 A1 | 2/2021 | Jones et al. |
| 2021/0071521 A1 | 3/2021 | Li et al. |

FOREIGN PATENT DOCUMENTS

| | | |
|---|---|---|
| WO | 2015060816 A1 | 4/2015 |
| WO | 2017019030 A1 | 2/2017 |
| WO | 2017105398 A1 | 6/2017 |
| WO | 2018056976 A1 | 3/2018 |
| WO | 2020096572 A1 | 5/2020 |

OTHER PUBLICATIONS

PCT Application Serial No. PCT/US2018/059349, International Search Report, dated Jul. 29, 2019, 4 pages.

PCT Application Serial No. PCT/US2018/059349, International Written Opinion, dated Jul. 29, 2019, 4 pages.

PCT Application Serial No. PCT/US2018/059355, International Written Opinion, dated Aug. 6, 2019, 6 pages.

PCT Application Serial No. PCT/US2018/059360, International Search Report, dated Aug. 6, 2019, 3 pages.

PCT Application Serial No. PCT/US2018/059360, International Written Opinion, dated Aug. 6, 2019, 6 pages.

PCT Application Serial No. PCT/US2018/059355, International Search Report, dated Aug. 6, 2019, 3 pages.

U.S. Appl. No. 16/481,980, Notice of Allowance, dated May 19, 2021, 10 pages.

PCT Application No. PCT/US2018/059349; IPRP; May 11, 2021, 5 pages.

PCT Application No. PCT/US2018/059355; IPRP; May 11, 2021, 7 pages.

PCT Application No. PCT/US2018/059360; IPRP; May 20, 2021, 7 pages.

U.S. Appl. No. 16/481,980; First Office Action; dated Jan. 25, 2021, 16 pages.

EP Application No. 2191540.0, Extended European Search Report, dated Dec. 7, 2021, 10 pages.

EP Application No. 18939773.0, Extended European Search Report, dated Oct. 18, 2021, 10 pages.

Chen, et al., "Fluid Optical Database Reconstruction With Validated Mapping from External Oil and Gas Information Source", PETROPI—IYSICS, vol. 59, No. 6; SPWLA-2018-v59n6a9, https://doi.org/10.30632/PJV59N6-2018a9, Dec. 2018, pp. 849-862.

Li, et al., "Downhole Signal Compression and Surface Reconstruction Based on Dictionary Machine Learning", OnePetro, SPWLA 61st Annual Logging Symposium, Virtual Online Webinar, Jun. 2020. Paper No. SPWLA-5088, https://doi.org/10.30632/SPWLA-5088, Jun. 22, 2020, 7 pages.

Olapade, et al., "Estimating Clean Reservoir Fluid Bubblepoint and Other Properties in Real Time Using PCA Asymptote of Optical Sensor Data and Equation of State", Society of Petroleum Engineers, SPE Annual Technical Conference and Exhibition, Dallas, Texas, USA, Sep. 2018. Paper No. SPE-191435-MS, Sep. 24, 2018, 12 pages.

* cited by examiner

DOWNHOLE SIGNAL COMPRESSION AND SURFACE RECONSTRUCTION

BACKGROUND

The disclosure generally relates to the field of subsurface characterization and more particularly to communication of subsurface measurements.

Fluid properties and certain other physical properties of matter change depending on their environment. Certain formation tester tools have the ability to measure various physical properties below the surface of the Earth to provide a means of characterizing a formation and determine formation/fluid properties to account for this phenomenon. The formation tester tools can include a device to provide formation pumpout measurements, wherein a sample of formation fluid is isolated from its surroundings and measured within the borehole at its original environment. These in-situ measuring devices make measurements that would be inaccurate or take too much time/cost if the measurements were made at the surface.

Many operations use sophisticated subsurface sensors that generate a significant amount of data within a short time period. The measurements are often communicated to the surface using techniques such as mud pulse telemetry, which limit the data bandwidth to a level far below the data acquisition rate of these subsurface sensors. Methods that optimize the data being transmitted to the surface are useful for formation evaluation and/or controlling a drilling operation, stimulation operation, or well production operation.

BRIEF DESCRIPTION OF THE DRAWINGS

Embodiments of the application can be better understood by referencing the accompanying drawings.

DESCRIPTION OF EMBODIMENTS

Figure 1:
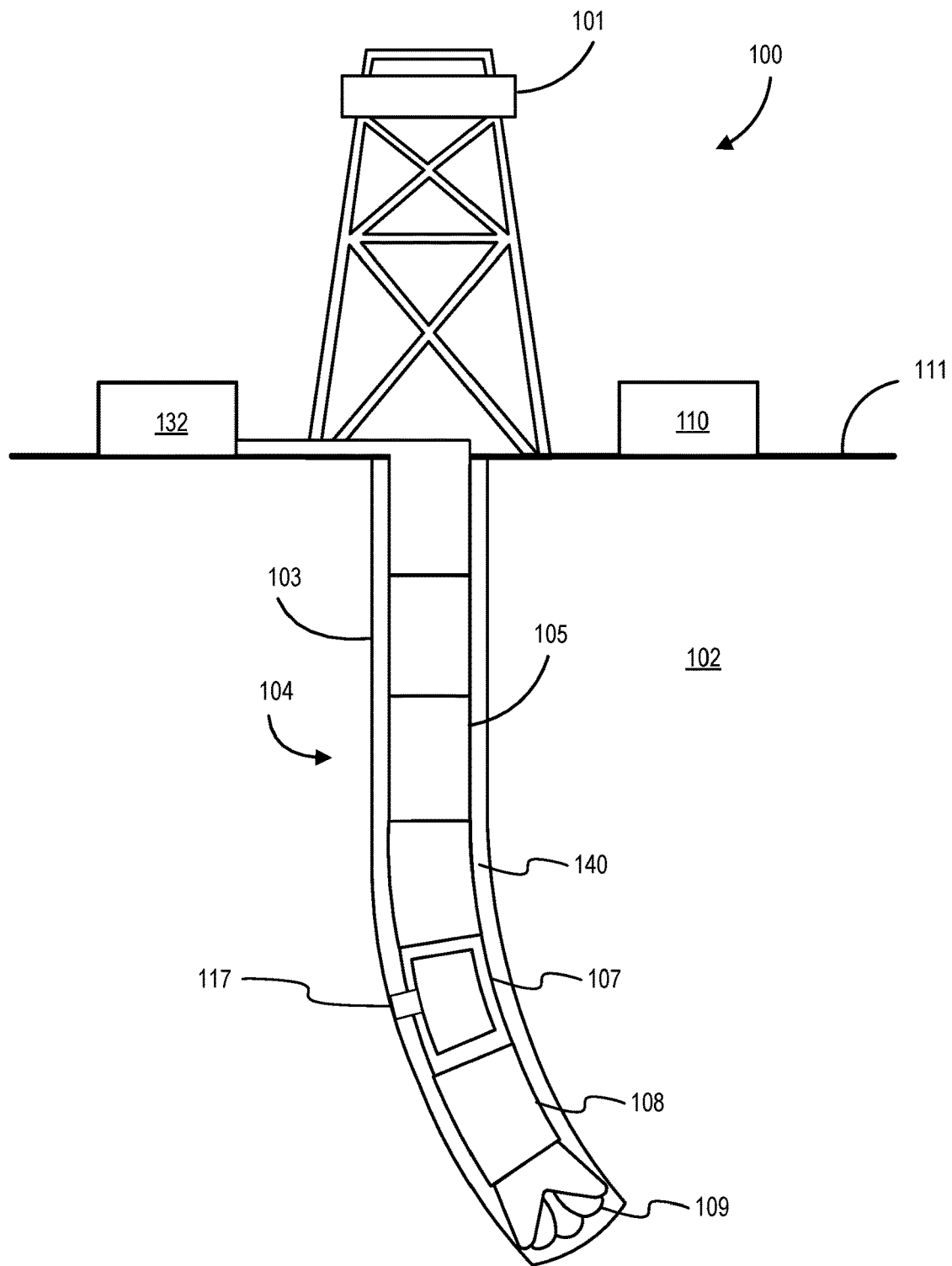
FIG. 1 is an elevation view of an onshore drilling system operating a downhole drilling assembly that includes a fluid measurement system.

The description that follows includes example systems, methods, techniques, and program flows that embody embodiments of the disclosure. However, it is understood that this disclosure can be practiced without these specific details. For instance, this disclosure refers to using results from a genetic algorithm method. Aspects of this disclosure can instead be applied to other nonlinear optimization methods such as a neural network method or a hybrid optimization method. In other instances, well-known instruction instances, protocols, structures and techniques have not been shown in detail in order to avoid obfuscating the description.

Various embodiments relate to a dictionary generation and usage system. An atom is a set of information that can include one of various signal patterns such as but not limited to patterns generated from machine-generated interpolations, sums of atom parameters that form signal patterns, polynomial functions, continuous functions, exponential functions, other functions representing signal patterns, etc. A system can obtain a set of atoms and use it as a dictionary ("atom dictionary") to construct either linear or nonlinear combinations of atoms from the atom dictionary ("atom combination"). In addition, each atom can have an L1 norm, wherein the L1 norm is the sum of the absolute values of the atom elements.

The system can augment the atom dictionary by adding a set of independently-determined atoms to the atom dictionary, resulting in an augmented dictionary. The system can further augment the dictionary by generating an augmented dictionary that does not include a least used set of atoms, wherein the least used set of atoms are atoms having the lowest weight values in a training set of atom combinations generated from testing the dictionary with a set of calibration or validation signals. The system can fit an atom combination to various measurement series, wherein a measurement series is a set of measurements over a measurement domain such as time or volume of sample fluid extracted.

A system can measure a borehole using one or more subsurface sensors inside of the borehole to produce a set of in-situ subsurface measurement series. After obtaining the in-situ measurement series, a subsurface processor located in the borehole can analyze the set of subsurface measurement series to generate an atom combination using atoms from the augmented dictionary. The system can use the subsurface processor to fit the atom combination to the subsurface measurement series using one or more residual characteristics that are based on a difference(s) between the atom combination and subsurface measurement series. In some embodiments, the system can access multiple atom dictionaries and can select one of the atom dictionaries based on which of the atom dictionaries have the best performance based on reconstruction quality and bit saving. In embodiments where the atom combination is a weighted sum of atoms, a set of characterizing values of the downhole data ("characterizing set") can be generated based on the atom combination, wherein the characterizing value can include atom weights, atom parameters, residual characteristics, etc. The number of bits used to transfer one or more values ("bit number") of the characterizing set can be varied depending on the weights and/or ranges of the weighted sum. For example, a first bit number can be greater than a second bit number when the first bit number corresponds with a first characterizing value that is associated with an atom with a greater weight or range and the second bit number corresponds with a second characterizing value that is associated with an atom with a lesser weight or range, wherein range is a numeric range corresponding to an atom parameter. In addition, the system can apply offset preprocessing to generate an offset parameter, which can be used in place of an atom parameter or atom identifier, as well as to generate constraint conditions to the processes signal. Such constraint conditions can be utilized to further improve the reconstruction or save the bits.

The system can generate a characterizing set based on the atom combination, the residual characteristics, and other values. The characterizing set can include characterizing values such as an atom identifier indicating each atom in the atom combination, atom parameters corresponding to each of the atoms, and an atom weight corresponding with each of the atoms. In addition, the characterizing set can include other values such as residual characteristics, a paradigm which allows correct interpretation of transmitted values, etc. Once a transmission threshold is satisfied, the system can communicate the characterizing set to a reconstruction processor at a different physical location (i.e. a location 5 meters away or more), wherein the different physical location can also be in the borehole away or at a location at the surface. The system can also store characterizing values in a buffer for later transmission. The system can use the reconstruction processor to generate a reconstructed atom combination based on the characterizing set. The system can then use the reconstructed atom combination to generate a set of reconstructed measurement series. The system can analyze the one or more sets of reconstructed measurement series provided by the augmented atom dictionary to determine at least one of a formation property, a fluid property, and a well status.

By augmenting an atom dictionary, the system can increase the accuracy of measurement series reconstruction. For example, a reconstruction accuracy such as the mean-square error (MSE) can be $4.9 \times 10^{-5}$ for an atom combination generated using an unaugmented dictionary, whereas the MSE can be $4.6 \times 10^{-5}$ for an atom combination generated using an augmented dictionary. In addition, the use of an augmented dictionary can decrease the number of bits necessary to generate an accurate atom combination. Additional storage of characterizing values in a buffer for later transmission can also reduce MSE values (e.g. reduce MSE values by 400%). Furthermore, the addition of bit number variation and offset preprocessing operations can increase the accuracy and decrease the needed bits for reconstructing the measurement series. Furthermore, the system can use the determined properties/statuses to modify a well testing operation such as reducing a testing flow rate of a sample fluid.

Example Well Systems

FIG. 1 is an elevation view of an onshore drilling system operating a downhole drilling assembly that includes a fluid measurement system. A drilling system 100 includes a rig 101 located at a formation surface 111 and positioned above a borehole 103 within a subsurface formation 102. In some embodiments, a drilling assembly 104 can be coupled to the rig 101 using a drill string 105. In other embodiments, the drilling assembly 104 can be coupled to the rig 101 using a wireline or a slickline, for example. The drilling assembly 104 can include a bottom hole assembly (BHA). The BHA can include a drill bit 109, a steering assembly 108, and a logging-while-drilling (LWD)/measurement-while-drilling (MWD) apparatus having a formation tester tool 107. The formation tester tool 107 can include a fluid isolator 117 to isolate a fluid for measurement. The formation tester tool 107 can measure various properties (e.g. temperature, composition, bubble point, etc.) of the fluid in the fluid isolator 117, either while the fluid is not flowing or while the fluid is flowing at a testing flow rate through the fluid isolator 117. The formation tester tool 107 or another component of the BHA can also include a subsurface processor to perform operations and generate results based on the measurements made by the formation tester tool 107.

During drilling operations, a mud pump 132 may pump drilling fluid (sometimes referred to as "drilling mud" or simply "mud") into the drill string 105 and down to the drill bit 109. The drilling fluid can flow out from the drill bit 109 and be returned to the formation surface 111 through an annular area 140 between the drill string 105 and the sides of the borehole 103. In some embodiments, the drilling fluid can be used to cool the drill bit 109, as well as to provide lubrication for the drill bit 109 during drilling operations. Additionally, the drilling fluid may be used to remove subsurface formation 102 cuttings created by operating the drill bit 109. Measurements or generated results can be transmitted to the surface using mud pulses (or other physical fluid pulses) traveling through the drilling mud (or other fluid) in the borehole 103. These mud pulses can be measured at the formation surface 111 and communicated to a reconstruction processor in the control and analysis system 110 located at the formation surface 111.

Figure 2:
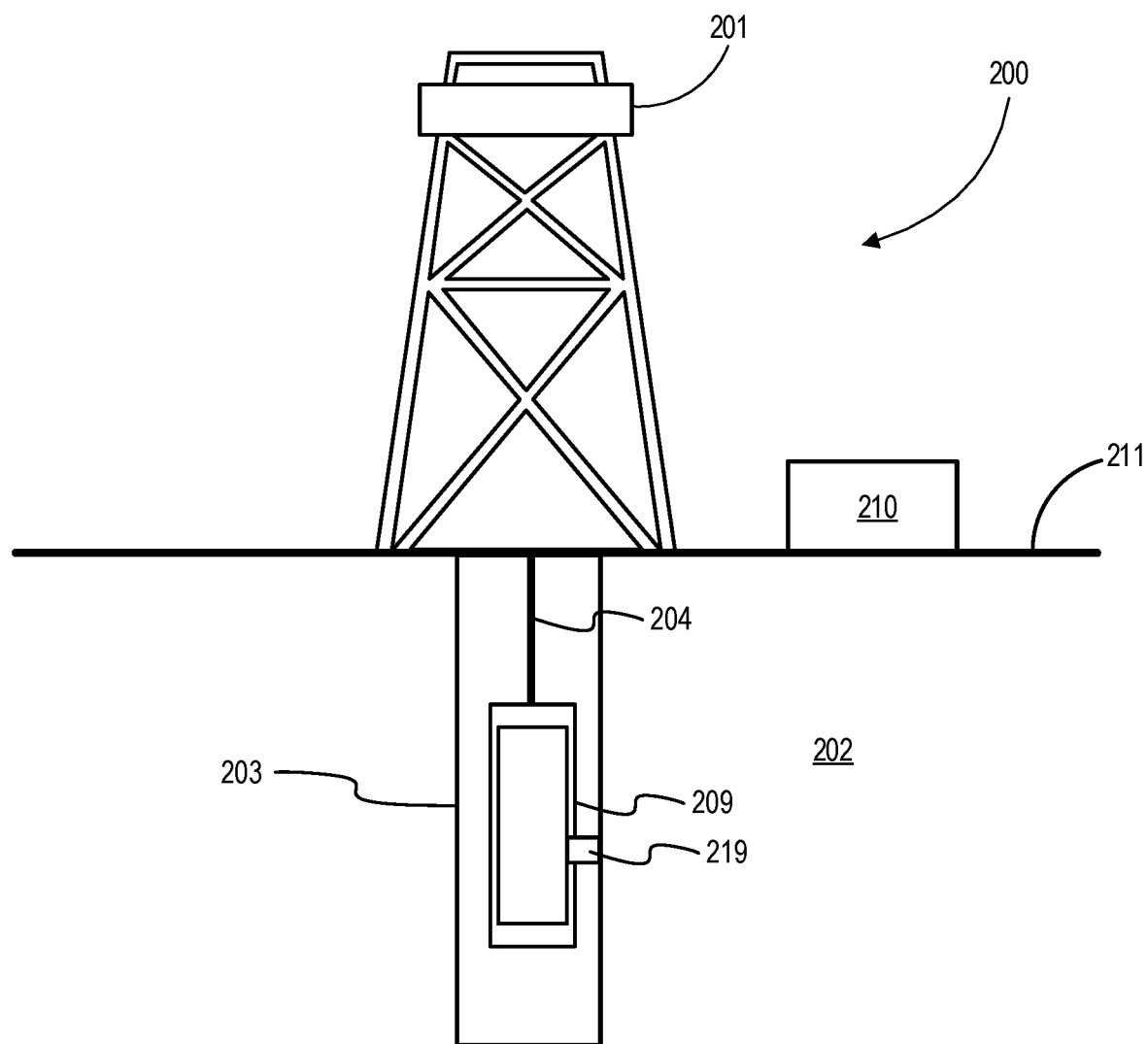
FIG. 2 is an elevation view of an onshore wireline system operating a wireline tool that includes a fluid measurement system.

FIG. 2 is an elevation view of an onshore wireline system operating a wireline tool that includes a fluid measurement system. A wireline system 200 includes a rig 201 located at a surface 211 and positioned above a wellbore 203 within a subterranean formation 202. The wireline system 200 can include a wireline 204 supporting a formation tester tool 209 that includes a fluid isolation chamber 219 and a subsurface processor. The fluid isolation chamber 219 can extract and isolate a formation fluid sample from its immediate surroundings. The fluid in the fluid isolation chamber 219 can be tested by the formation tester tool 209 to provide various formation measurements about the wellbore 203 and the subterranean formation 202. A control and analysis system 210 located at the surface 211 can include a reconstruction processor and memory device and can communicate with elements of the formation tester tool 209.

During well testing operations, the wireline 204 can transmit characterizing values generated by the subsurface processor in the formation tester tool 209 to the surface 211 via the wireline 204. In some embodiments, the results provided from the operations disclosed below can be transmitted via the wireline 204. Alternatively, the results can be communicated via fluid pulses traveling through fluids in the wellbore 203 or electromagnetic signals to the surface 211. Once at the surface 211, the characterizing values can be communicated to the reconstruction processor in the control and analysis system 210.

Example Flowcharts

Figure 3:
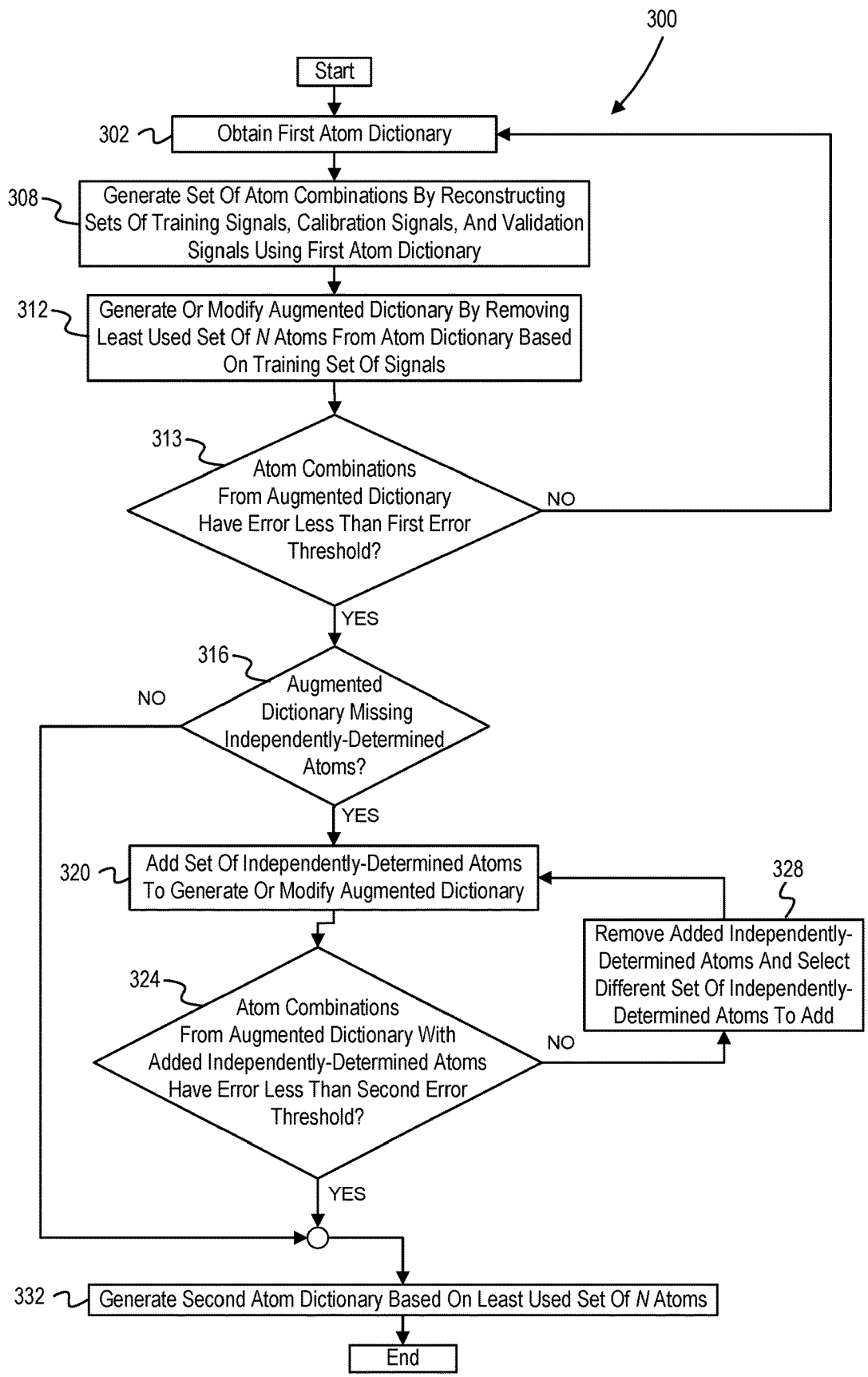
FIG. 3 depicts a flowchart of operations to augment an atom dictionary.

FIG. 3 depicts a flowchart of operations to augment an atom dictionary. FIG. 3 depicts a flowchart 300 of operations that are described with reference to a system comprising a processor. Operations of the flowchart 300 start at block 302.

At block 302, the system obtains a first atom dictionary. The first atom dictionary can be obtained by acquiring the first dictionary from a database. Alternatively, the first atom dictionary can be obtained by generating the dictionary using machine-learning methods to generate the atoms of the first atom dictionary based on a training set of signals. In some embodiments, the system can first subtract an offset pattern from the training set of signals as a preprocessing step, wherein the offset pattern can be determined based on an average value(s) of an initial training set of signals, a predetermined value, a fitted function, etc. In addition, the system can calculate a L1 norm associated with each of the atoms, wherein each of the L1 norms are the sum of the absolute values of each of the atom elements. For example, a system can calculate an L1 norm of a first atom that has five atom elements using Equation 1 below, wherein $L_{f_1}$ is the L1 norm associated with the atom A1 and each of its five atom elements are represented by terms A1(1), A1(2), A1(3), A1(4), A1(5):

$$L_{f1} = |A1(1)| + |A1(2)| + |A1(3)| + |A1(4)| + |A1(5)| \quad (1)$$

Example machine-learning methods can include a K-means method, a singular value decomposition method, some combination thereof, etc. The system can obtain the atom dictionary by training the machine-learning method on one or more training sets of signals that can include an initial set of subsurface measurement series. The initial set of subsurface measurement series can include one or more values that have been generated using a simulation of a well, acquired from sensors in a well, randomly generated from a random number generator, etc. Likewise, the system can generate the atom parameters of the atoms in the atom dictionary based on training signals, calibration signals, and/or validation signals using the machine-learning methods discussed above. Each of the atom parameters can be one or more numeric values, pattern descriptors, categories, or function parameters used to describe a portion of an atom.

At block 308, the system generates sets of atom combinations by reconstructing a sets of training signals, calibration signals, and validation signals using the first atom dictionary. The training signals, calibration signals, and validation signals can be measurement series. The system can reconstruct the signals by fitting one or more atom combinations to the signals, wherein the fitting is done with respect to treating one or more residual characteristics (further described below) as a cost function. The atom combinations can be weighted sums of a set of atoms from the atom dictionary. For example, the system can determine that an atom combination is equal to F as shown in Equation 2, wherein each atom $A_i$ is the i-th atom in the atom combination, N is the total number of atoms in atom combination, and $w_i$ is a corresponding atom weight for $A_i$:

$$F = \Sigma_{i=1}^{N} w_i A_i \quad (2)$$

While the system can systematically generate every possible atom combination from an atom dictionary and select for a least residual characteristic, the system can also use other optimization methods. In some embodiments, the system can determine the atom combination from an atom dictionary or even select an atom dictionary using machine-learning methods or other nonlinear optimization methods. The system can generate atom combinations using various nonlinear optimization methods such a genetic algorithm (GA) method, a neural network method, or a hybrid algorithm method, wherein the hybrid algorithm can be based on a GA method and artificial neural network (ANN) method. For example, the system can use a GA method to select an atom combination and a set of atom elements for the atom combination, using one or more of the residual characteristics further described below as a cost function.

In addition to the atom combinations, the system can calculate one or more residual characteristics associated with the atom combinations. Residual characteristics can be calculated based on a comparison between one or more of the measurement series (e.g. the validation signals) and one or more values from an atom combination. The residual characteristics can include values such as a lack of fit (LOF), noise in the dataset, one or more other model errors (e.g. mean square error, etc.). For example, a residual characteristic value of mean square error can be determined by taking the mean of the squares of the difference between the atom combination shown in Equation 1 and the subsurface measurement series.

At block 312, the system generates or modifies an augmented dictionary by removing a least used set of N atoms from the atom dictionary based on the training set of signals. Removing the least used set of N atoms from the atom dictionary can include generating an atom dictionary without the least used set of N atoms. The system can generate the augmented dictionary if the first dictionary has not yet been changed, or the system can modify the augmented dictionary if the first dictionary has already been changed from its initial form when first obtained at block 302. The value of the integer N can be a predetermined value, can be generated from a ratio of the total number of atoms in the atom dictionary, or can be dependent on the number of atoms that satisfy one or more removal criteria. For example, the value of the integer N can be predetermined to be the integer 11 or can be calculated to be 15% of the number of atoms the atom dictionary. In some embodiments, the value N can be reduced to zero, effectively allowing blocks 312 and 313 (described further below) to be circumvented.

The system can use various criteria to determine the least used set of N atoms. In some embodiments, the system can determine the least used set of N atoms based on which of the atoms in the atom dictionary are least used in the training set of atom combinations. For example, if N=5, the system can detect that a particular set of five atoms were not used in any of the training set of atom combinations. In response, they system can determine that this particular set is the least used set of N atoms. Alternatively, the system can determine how much an atom is used based on a sum of its corresponding atom weight(s) in the training set of atom combinations. For example, if an atom dictionary includes five atoms and each of the five atoms are used at least once in the training set of atom combinations, the system can determine that an example first atom has a combined atom weight of 0.39 from summing the atom weights of 0.34 in a first atom combination and 0.05 in a second atom combination, and that an example second atom has a combined atom weight of 0.89 from having an atom weight of 0.89 in the first atom combination. Based on these values, the system can determine that the first atom has a lower combined atom weight in comparison to the second atom, wherein the combined atom weight of the second atom can be used as a weight threshold. Thus, the first atom is less used than the second atom.

At block 313, the system determines whether the atom combinations from the augmented dictionary have an error less than a first error threshold. In some embodiments, the first error threshold is equal to the initial error value determined when generating the training set of atom combinations described for block 308. For example, an average mean squared error (MSE) value for a training set of atom combinations determined at block 308 can be equal to 1.3% and, in response, the system can set 1.3% as a first error threshold. Thus, if the system generates a trial set of atom combinations having a corresponding average MSE of 1.2%, the system can determine that the atom combinations from the augmented dictionary has an error less than the first error threshold. Alternatively, the system can use a first error threshold that is based on, but not equal to, an initial error value determined from generating the training set of atom combinations. For example, the system can use a ratio of the initial error value (e.g. 50% of the initial error value). If the system determines that the atom combinations from the augmented dictionary have an error less than a first error threshold, the system can proceed to block 316. Otherwise, the system can return to block 302 to re-generate an atom dictionary that does not include the least used set of N atoms.

At block 316, the system determines whether the augmented dictionary is missing one or more independently-determined atoms. In some embodiments, the system can determine whether the atom dictionary is missing any independently-determined atoms by comparing the first atom dictionary with a independently-determined set of atoms. If one or more atoms in the independently determined set of atoms are not present in the augmented dictionary, then the system can determine that the augmented dictionary is missing the one or more independently-determined atoms. If the system is missing one or more independently-determined atoms, the system can proceed to block 320. Otherwise, the system can proceed to block 332.

At block 320, the system adds a set of independently-determined atoms to generate or modify the augmented dictionary. The system can obtain the independently-determined atoms from a database of independently-determined atoms. Alternatively, the system can obtain the set of independently-determined atoms by generating the set of independently-determined atoms either before or after obtaining the augmented dictionary. After obtaining the set of independently-determined atoms, the system can add the set of independently-determined atoms to the augmented dictionary. For example, the system can augment an atom dictionary by adding an independently-determined atom having a signal pattern of a straight line atom to the dictionary. Furthermore, in some embodiments, the number of added independently-determined atoms can be equal to the least used set of atoms having N atoms as described for block 312. Alternatively, the system can add independently-determined atoms independently of the number of atoms removed. In some embodiments, an added independently-determined atom can be distinguished from atoms in the first set of atoms based on the continuity or the ideal shape of the added independently-determined atom. In some embodiments, the ideal shape can be determined by the continuity of the independently-determined atom's offset-free first derivative values. For example, the first set of atoms can be generated based on machine-learning methods which produce atoms having signal patterns with non-continuous first derivative values, and the system can add an atom having signal patterns with continuous first derivative values.

At block 324, the system determines whether the atom combinations from the augmented dictionary with added independently-determined atoms have an error less than a second error threshold. In some embodiments, the second error threshold is equal to the first error value described above for block 313. For example, the second error threshold can be 1.3% if the first error threshold is 1.3%. Thus, if the system uses an augmented dictionary with added independently-determined atoms to generate atom combinations having a corresponding average MSE of 1.2%, the system can determine that the atom combinations from the augmented dictionary has an error less than the second error threshold. Alternatively, the system can use a second error threshold that is based on, but not equal to, either the first error threshold or an error value determined from generating the training set of atom combinations. For example, the system can use a ratio of the initial error value (e.g. 50% of the initial error value). If the system determines that the atom combinations from the augmented dictionary have an error less than a second error threshold, the system can proceed to block 332. Otherwise, the system can proceed to block 328.

At block 328, the system removes the added independently-determined atoms and selects a different set of independently-determined atoms to add. In some embodiments, after determining that adding the independently-determined atoms does not reduce the error below an acceptable error threshold (i.e. the second error threshold), the system can remove the added independently-determined atoms from the augmented dictionary. The system can then select a different set of independently-determined atoms using a selection method and return to the operations described for block 328 to add a different set of independently-determined atoms. In some embodiments the system can have multiple sets of independently-determined atoms stored and select the different set of independently-determined atoms from the multiple sets of independently-determined atoms.

At block 332, the system generates a second atom dictionary based on the least used set of N atoms. In some embodiments, the least used set of N atoms can be used as a seed set of atoms, and the system can use the seed set of atoms in a machine-learning method to generate a second atom dictionary. The system can also repeat any or all of the operations described for the flowchart 300 using the second atom dictionary in place of the first atom dictionary to generate a second augmented dictionary. In some embodiments, the system can use a different set of training signals, calibration signals, and/or validation signals from those used for the first atom dictionary at block 302 and/or block 308. In some embodiments, the system can use a subset of the first training signals described for block 302 and/or block 308, such as the subset of training signals corresponding with a reconstruction accuracy less than a training reconstruction accuracy threshold during the generation of the first atom dictionary. In some embodiments, the second augmented dictionary can be used as an alternative dictionary. For example, if the augmented dictionary described for operations for block 320 is a first augmented dictionary, and if a LOF or other residual characteristic is determined to be greater than a library residual characteristic threshold when generating a reconstructed measurement series using the first augmented dictionary, the system can generate a reconstructed measurement series using the second augmented dictionary in response.

Figure 4:
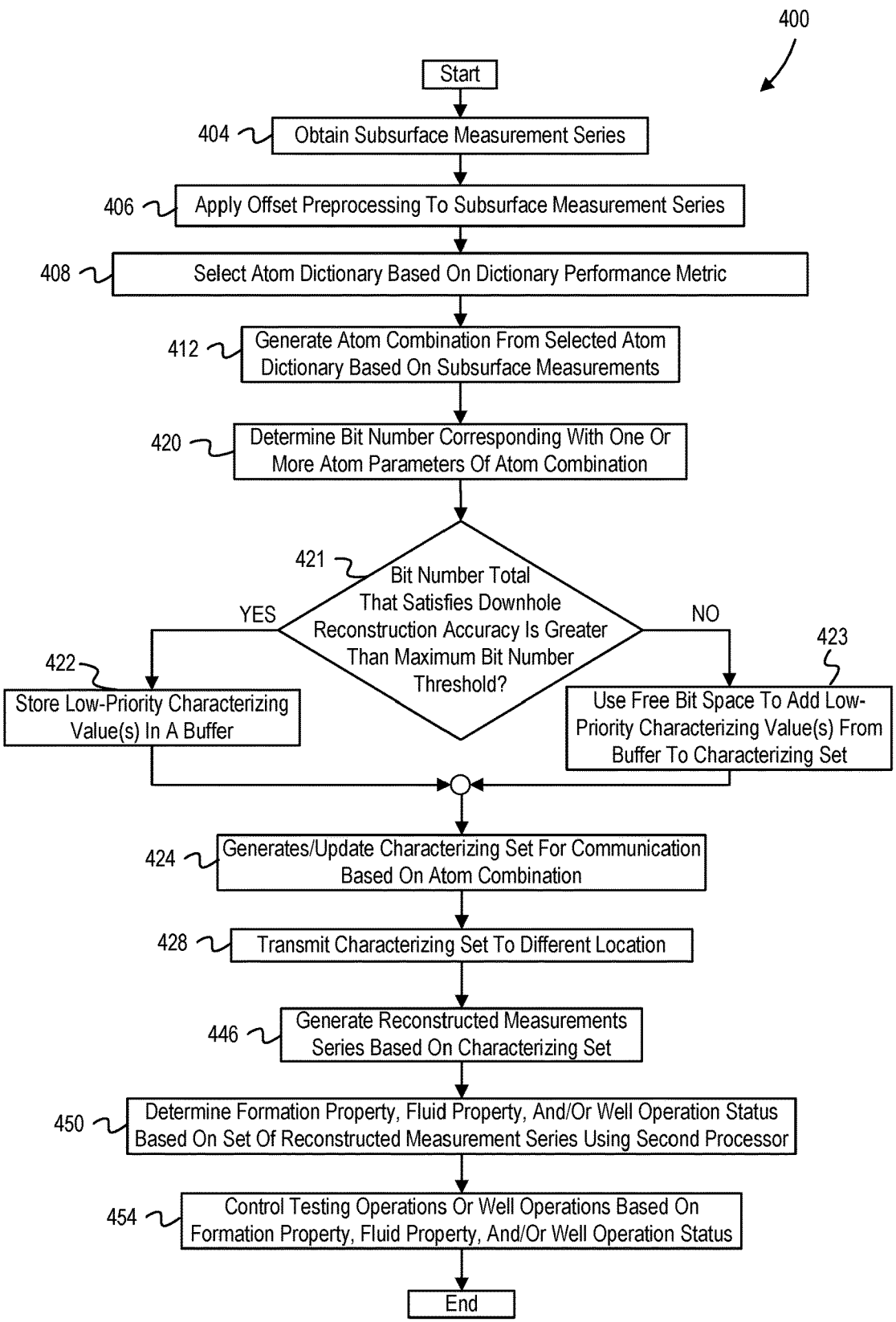
FIG. 4 depicts a flowchart of operations to communicate a set of subsurface measurement series.

FIG. 4 depicts a flowchart of operations to communicate a set of subsurface measurement series. FIG. 4 depicts a flowchart 400 of operations that are described with reference to a system comprising a subsurface processor and as a reconstruction processor. With reference to FIG. 3, operations of the flowchart 400 start at block 404 and can use one or more of the augmented dictionaries generated using operations described for the flowchart 300.

At block 404, the system obtains subsurface measurement series. The system can obtain the subsurface measurement series from a set of sensors in a borehole. For example, the subsurface measurement series can include fluid composition measurements, pressure measurements, temperature measurements, electromagnetic measurements, etc. In some embodiments, the system can obtain the subsurface measurement series over time and/or distance (e.g. depth).

At block 406, the system applies offset preprocessing to the subsurface measurement series. Offset preprocessing includes generating one or more offset patterns that can be removed from the measurement series such that the measurement series satisfies certain constraint conditions after offset preprocessing, wherein the constraint condition is a condition between a subsurface measurement series and its corresponding offset pattern that can be shared across multiple subsurface measurements from a set of sensors in a borehole. For example, a measurement series preprocessing constraint condition can be that, after preprocessing, the average value of the subsurface measurement series is equal to a preset value such as zero. Alternatively, or in addition, satisfying a constraint condition can include satisfying the condition that a difference between the subsurface measurement series and the corresponding offset pattern is orthogonal to the corresponding offset pattern. In some embodiments, the offset pattern can be a constant value at every measurement across the entire subsurface measurement series, wherein the offset pattern parameter is equal to the average value of the subsurface measurement series. Thus, the average value of the difference between the subsurface measurement series and the offset pattern parameter is zero in this example. In some embodiments, different subsurface measurement series measured at different time intervals will have different average values, which results in the generation of different offset patterns, but the differences between each of the subsurface measurement series and their corresponding offset pattern parameters will remain equal to the same preset value until the system transmits instructions to change the preset value.

Alternatively, the offset pattern can vary in the measurement space. For example, the system can separate the subsurface measurement series into a first and second half to generate an offset pattern that has a first constant offset value for the first half of the subsurface measurement series and a second constant offset value for the second half of the subsurface measurement series. As another alternative, the system can set one or more sinusoidal functions as an offset pattern(s). Each of the offset patterns can be characterized by one or more offset pattern parameters, which, when used together, define the value of the offset pattern along a measurement domain.

At block 408, the system can select an atom dictionary based on a dictionary performance metric. In some embodiments, the system can access multiple dictionaries having different dictionary lengths. Based on this, the system can select an atom dictionary from a set of atom dictionaries, wherein the corresponding signal length of the selected atom dictionary is selected based on a dictionary performance metric related to at least one of a reconstruction accuracy threshold and a first bit number threshold. In some embodiments, the system can select an atom dictionary based on which of the set of atom dictionaries allows the system to generate an atom combination that minimizes a number of bits (which can be a first dictionary performance metric) while still satisfying the reconstruction accuracy threshold, wherein an atom combination satisfies the reconstruction accuracy threshold when its reconstruction accuracy (which can be a second dictionary performance metric) with respect to the subsurface measurement series is greater than or equal to the reconstruction accuracy threshold. In some embodiments, the system can select an atom dictionary based on which of the set of atom dictionaries allows the system to generate an atom combination that maximizes the reconstruction accuracy while satisfying the first bit number threshold, wherein an atom combination satisfies the first bit number threshold when the number of bits used to transmit a characterizing set is less than or equal to the first bit number threshold. In some embodiments, the system can access dictionaries with various other signal lengths in order to use a dictionary more likely to capture phenomena relevant to a measurement series. For example, the system can select an atom dictionary having a corresponding signal length of 256, 500, 1000, etc.

At block 412, the system can generate an atom combination from the selected atom dictionary based on the subsurface measurement series. The atom combination can be generated from the selected atom dictionary using various machine-learning methods and/or other optimization methods. For example, the system can apply a supervised learning model to determine the atom weights, atoms, and atom elements comprising the functions in Equation 3 below, wherein $F_1$ represents an atom combination, d represents a measurement domain, $w_1$, $w_2$ and $w_3$ are atom weights, $A_1$, $A_2$ and $A_3$ are atoms that correspond with one of the atoms in the selected atom dictionary:

$$F_1 = w_1 A_1 + w_2 A_2 + w_3 A_3 \quad (3)$$

At block 420, the system can determine a bit number corresponding with one or more atom parameters of the atom combination. In some embodiments, the system can communicate a first atom parameter associated with a first atom using a first bit number and transmit a second atom parameter associated with a second atom using a second bit number, wherein the first bit number is greater than the second bit number. In such embodiments, the first bit number is equal to a count of bits used to transmit the first atom parameter and the second bit number is equal to a count of bits used to transmit the second atom parameter, wherein the characterizing set includes the first atom parameter and the second atom parameter. Each of the atom parameters have a corresponding bit number based on a contribution value of each of the atoms. For any particular atom, the contribution value can be based on the associated L1 norm and/or associated weight of an atom. For example, to reconstruct a first particular measurement series and a second measurement series, the system can use Equations 4-5, wherein $F_3$ and $F_4$ are atom combinations, and $A_1$, $A_2$, $A_3$, $A_4$, and $A_5$ are atoms having the respective atom weights of 5, 2, 3, 1.5, and 0.5:

$$F_3 = 5A_1 + 2A_2 \quad (4)$$

$$F_4 = 3A_3 - 1.5A_4 + 0.5A_5 \quad (5)$$

The system can determine a contribution value of the atom based on their respective atom weights and the respective L1 norm values of the atoms. In some embodiments, the contribution value of an atom can be an absolute value of the product of its atom weight and its respective L1 norm value. For example, with reference to Equation 3, if the L1 norm value of $A_1$ is 10 and the L2 norm value of $A_2$ is 11, the contribution values of $A_1$ and $A_2$ can be 50 (i.e. Abs[5*10]) and 22 (i.e. Abs[2*11]), respectively. Alternatively, other combinations of the atom weights and L1 norm values are possible. For example, the system can treat the sum of an L1 norm value and an atom weight as the contribution value.

Based on the contribution value, the system can determine an atom rank, wherein the atom ranks are sorted by the contribution values. For example, with respect to Equation 4, if the contribution value for $A_3$ is 30, and if the contribution value for $A_4$ is 150, and if the contribution value for $A_5$ is 10, the system can sort each of the atoms into an equal number of ranks, wherein $A_4$ is associated with a first rank, $A_3$ is associated with a second rank, and $A_5$ is associated with a third rank. Alternatively, the system can sort each of the atoms into a different number of ranks. For example, the system can associate $A_4$ and $A_3$ with the first rank and $A_5$ with the second rank.

Each atom rank can be associated with a bit number. For example, the first rank can be associated with a bit number of 10, the second rank can be associated with a bit number of 8, etc. In some embodiments, the system can associate an atom with a bit number in a particular atom combination. For example, with respect to Equation 3, the system can determine that the atom rank of the atom $A_1$ is a first rank, wherein the first rank has an associated bit number of 10. In response, the system can associate the bit number of 10 to the atom $A_1$.

At block 421, the system determines whether a bit number total that satisfies a downhole reconstruction accuracy is greater than a maximum bit number threshold. In some embodiments, the bit number total is the sum of the bit numbers associated with each of atoms in an atom combination, wherein a reconstruction accuracy of the atom combination (such as a MSE value or set of MSE values) is greater than a downhole reconstruction accuracy threshold. A bit number total can satisfy the downhole reconstruction accuracy if the atom combination associated with the bit number total satisfies the downhole reconstruction accuracy. The downhole reconstruction accuracy threshold can be the same as or different from the reconstruction accuracy threshold disclosed for block 408. For example, with respect to Equation 3, if the bit number of the atom $A_1$ is equal to 10 and the bit number of the atom $A_2$ is equal to 8 and the reconstruction accuracy of the atom combination $F_3$ generate a downhole reconstruction accuracy threshold, the bit number total would be equal to 25. A maximum bit number threshold can be based on a bandwidth of a data transmission method. A maximum bit number threshold can be values such as 10 bits, 20 bits, 50 bits, etc., and can be equal to or different from the first bit number threshold discussed above for block 408. If the system determines that the bit number total that satisfies a downhole reconstruction accuracy is greater than the maximum bit number threshold, the system can proceed to operations for block 422. Otherwise, the system can proceed to operations for block 423.

At block 422, the system stores one or more low-priority characterizing values in a buffer. A low-priority characterizing value can be an atom identifier, atom element, atom weight, or other characterizing value associated with an atom in a set of low-priority atoms. A system can determine the set of low-priority atoms from an atom combination that are not in the set of high-priority atoms, wherein the set of high-priority atoms are a set of atoms each having a greater contribution value than the set of low-priority atoms, and wherein the bit number total of the set of high-priority atoms is less than the maximum bit number threshold. For example, with reference to Equation 4, if the maximum bit number threshold is 20, and if the bit numbers corresponding to $A_3$, $A_4$ and $A_5$ are 10, 8 and 6, then the set of high-priority atoms is $[A_3, A_4]$ while the set of low-priority atoms is $[A_5]$. In some embodiments, instead of storing one or more characterizing values directly from the low-priority atoms, the system can first generate a residue (e.g. the subsurface measurement series minus a reconstruction using the high-priority atoms). The system can then determine a residue based on one or more differences between the subsurface measurement series and the initial reconstructed measurement series, wherein the residue itself can be a measurement series. The system can then generate a set of atoms that can reconstruct the residue ("set of residue-reconstructing atoms") and store one or more characterizing values corresponding with the set of residue-reconstructing atoms as the low-priority characterizing values in the buffer.

At block 423, the system can use free bit space to add one or more low-priority characterizing values from the buffer to a characterizing set. The system can determine a free bit space to be equal to the difference between a maximum bit number threshold and the bit number total that satisfies downhole reconstruction accuracy. For example, if a bit number total that satisfies downhole reconstruction accuracy is equal to 24 and the maximum bit number threshold is 30, the free bit space is equal to 6. The system can add one or more low-priority characterizing value stored in the buffer described for block 422 to a characterizing set for communication (described further below for block 424) based on which set of the low-priority characterizing values have the highest associated contribution values while still being less than or equal to the free bit space. As described further below for block 424, the system can then communicate the characterizing set that includes added low-priority characterizing values to a different location. If the free bit space is less than the bit number of any available low-priority characterizing values in the buffer, the system can skip operations described for block 423.

At block 424, the system generates or updates a characterizing set for communication based on the atom combination. The characterizing set includes various values usable to generate a reconstructed measurement series based on a selected atom combination, the selected combination's corresponding residual characteristics, and any offset patterns generated using the operations described for block 406. In some embodiments, the characterizing set can include an atom identifier indicating each of the atoms used in the atom combination, the corresponding atom weights of each of the atoms, the atom parameters for each of atoms, one or more residual characteristics, and/or a paradigm to help accurately interpret the characterizing set. In some embodiments, the system can use an offset pattern as a characterizing value instead of an additional atom identifier or atom parameter, which can reduce the total number of bits used to transfer the characterizing set. For example, instead of generating a first characterizing set including 11 atom identifiers along with 11 atom parameters, the system can instead generate a second characterizing set that would provide the same accuracy as the first characterizing set but instead include 10 atom identifiers, 10 atom parameters, and a single offset pattern parameter.

In addition, as described above, the characterizing set can include one or more low-priority characterizing values described for block 423. As discussed above, after transmitting an initial characterizing set corresponding to an initial atom combination, the system can transmit a later characterizing set corresponding to the same initial atom combination, wherein the later characterizing set is stored in the buffer discussed for block 423. For example, the system can transmit an initial characterizing set corresponding to 10 atoms from an initial atom combination and store a later characterizing set corresponding to 10 atoms, wherein the initial characterizing set include characterizing values corresponding to high-priority atoms and the later characterizing set include low-priority characterizing values. In this example, the later characterizing set can directly correspond to atoms in the initial atom combination or can instead be from a residue-reconstructing set that can be used to reconstruct a residue based on a subsurface measurement series and a reconstruction using the high-priority atoms. The system can then transmit a characterizing set having the later characterizing set to the different physical location at a later time.

At block 428, the system communicates the characterizing set to a different location. The collection of parameters, corresponding error statistics, atom-identifying information, and other values collectively form a characterizing set. The characterizing set can be communicated to the surface or to a different location in the borehole using fluid pulse telemetry (i.e. using a series of fluid pulses), optical cables (i.e. using a series of optical pulses), electromagnetic waves, electrical signals traveling through a conductive wire, etc. The number of bits used to transmit one or more characterizing values of the characterizing set can be based on the bit numbers previously determined using operations described for block 420.

At block 446, the system generates a set of reconstructed measurement series based on the characterizing set. The system can generate the set of reconstructed measurement series by first determining function values using a reconstructed atom combination, wherein reconstructing the atom combination includes using characterizing values. After reconstructing the atom combination, the system can add randomization to the values by using the residual characteristics from a random function. In some embodiments, the system can use a Monte Carlo method to reconstruct the set of random values, wherein the residual characteristics can be used to determine parameters used by the Monte Carlo method. For example, the system can use residual characteristics as Monte Carlo parameters to determine confidence bands and error tolerances for each of the simulated measurement times in the set of reconstructed measurement series when generating the set of reconstructed measurement series. In some embodiments, the system can perform a later reconstruction to generate a second reconstructed measurement series corresponding to the same time interval as a first measurement series, wherein the system reconstructed the first measurement series using an initial characterizing set and reconstructed the second reconstructed measurement series using both the initial characterizing set and a later characterizing set. For example, the system can use an initial characterizing set to generate a first reconstructed measurement series, use a later characterizing set to generate a reconstructed residual series, and add the first reconstructed measurement series to the reconstructed residual series to generate the second reconstructed measurement series. In this example, the later characterizing set can be transmitted at a time after the initial characterizing set. Alternatively, the later characterizing set can include characterizing values directly corresponding to atoms from the same atom combination as the initial characterizing set.

At block 450, the system can determine a formation property, fluid property, and/or well status based on the reconstructed measurement series. In some embodiments, the system can determine a particular formation or fluid property directly from measurements of that particular formation or fluid property. For example, the system can determine a fluid density over a measured period of time by determining the average density of a set of reconstructed measurement series of density. In some embodiments, the system can also determine at least one of a formation property, fluid property, and well status based on the atoms of the atom combination, their corresponding atom weights, and/or classifications transmitted in the characterizing set.

In some embodiments, the system can determine the formation property and/or fluid property by applying fitting methods to generate curves for the reconstructed measurement series. The system can compare these curves, values predicted by the curves, integrals of these curves, and/or the derivatives of these curves to a library of known behaviors to determine the formation property, fluid property, or well status. In addition, the system can determine whether one or more physical phenomena are occurring and associate an indicator of the one or more physical phenomena. For example, the system can determine that a testing operation is fractionating reservoir fluid based on a reconstructed measurement showing a reduced pressure relative to a total volume of fluid collected. Alternatively, or in addition, the system can compare the curves to a library of known behaviors to determine whether other phenomenon or compositions are present, such as asphaltene precipitation, gas drop-out, emulsion, etc. In some embodiments, the system can directly analyze the curves to determine formation or fluid property. For example, the system can independently determine a dew point without referencing a library of known behaviors by determining where generated curves show an intersection at a particular state.

In some embodiments, the system can determine a well status based on the reconstructed measurement series. A well status is a quantitative or categorical value that reflects at least one parameter of well operations (e.g. drilling status, drilling speed, production flow rate, whether or not any components are damaged in the well, etc.) The system can determine a well status by analyzing the reconstructed measurement series to generate a status indicator. For example, the system can compare the curve to a library of known behaviors to determine that mud particulates are present in a sample of formation fluid. In some embodiments, the system can also compare the curves to a library of known behaviors to determine that non-formation effects are interfering with well testing operations. For example, the system can determine that a reconstructed measurement has a fluid density and electric resistivity associated with a particular non-formation fluid contamination percentage ("contamination level"), and that the particular contamination level exceeds a contamination threshold. Based on the contamination level exceeding the contamination threshold, the system can generate a status indicator to indicate that non-formation effects are interfering with well-testing operations. In response, the system can generate a status indicator that indicates that a pad in the borehole is leaking. Furthermore, the system can generate various other status operations, each of which can indicate one or multiple well statuses.

At block 454, the system can control testing operations or well operations based on the formation property, fluid property, and/or well status. In some embodiments, controlling testing operations can include sending instructions to a formation tester tool to reduce a testing flow rate, increase a calibration time, change a testing time, modify a testing pressure, and/or change the formation tester tool measurement depth before testing fluid properties again at the changed measurement depth. For example, the system can determine that the testing operation is fractionating reservoir fluid or inducing asphaltene precipitation and, in response, reduce a testing flow rate. Alternatively, or in addition, the system can determine that the contamination level exceeds a contamination threshold and increase a calibration period in response. As another example, the system can determine that a testing flow rate is insufficient or that the reconstructed measurement series are not indicative of any hydrocarbon presence and, in response, send instructions to modify a formation tester tool depth before obtaining more subsurface measurement series. Furthermore, the system can control testing operations or well operations by providing indicators of the formation property, fluid property, and/or well status to an artificial intelligence control system. For example, the system can provide the indicators of the well status to a feed-forward artificial intelligence system to control a drilling direction.

The flowcharts above are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operations depicted in blocks 420-424 of FIG. 4 can be performed in parallel or concurrently. As another example, with respect to FIG. 4, applying offset preprocessing as disclosed in block 406 is not necessary. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

Example Data

Figure 5:
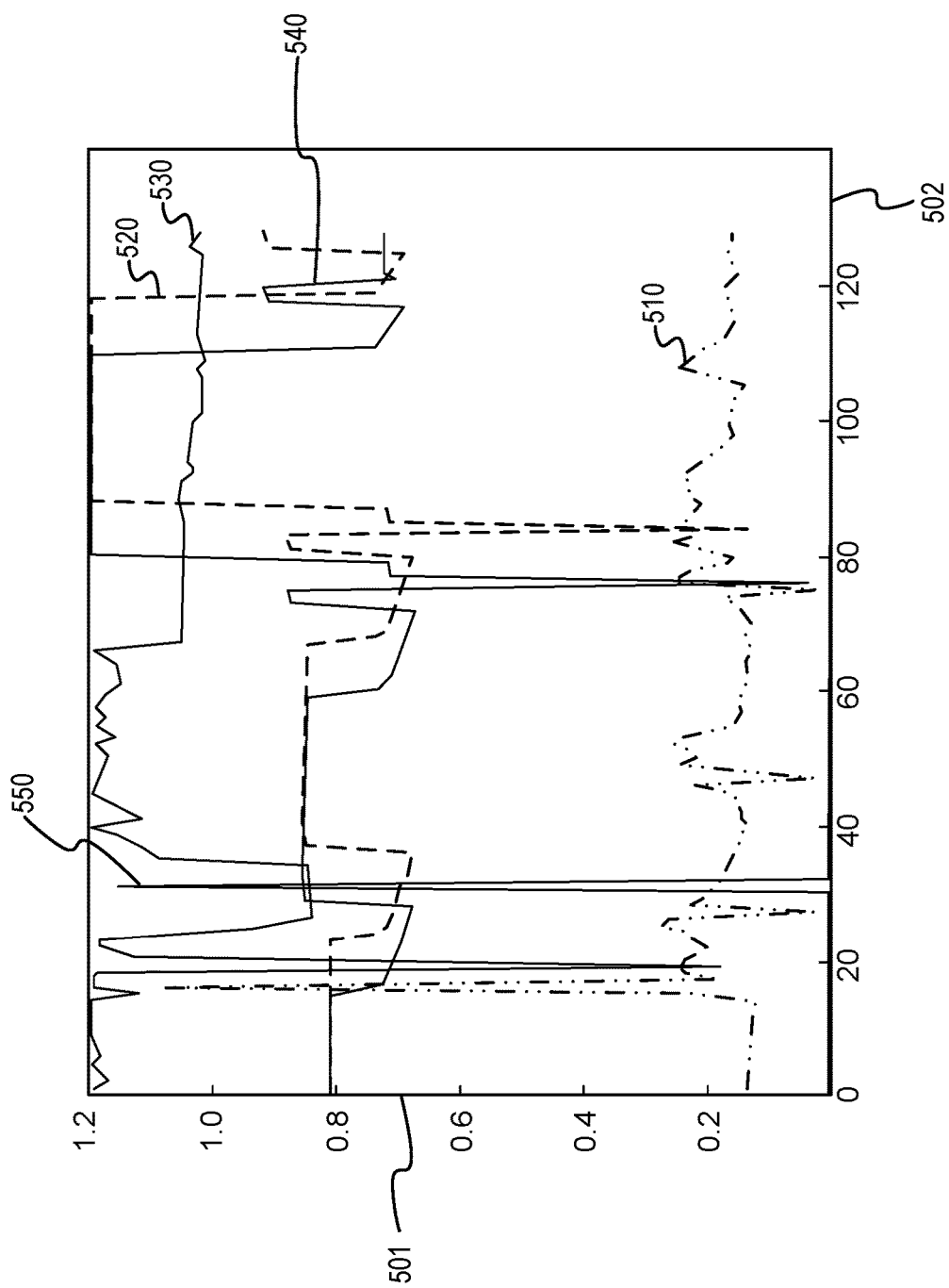
FIG. 5 depicts an example set of signals.

FIG. 5 depicts an example set of signals. The densitometry plot 500 has a vertical axis 501 and a horizontal axis 502. The vertical axis 501 corresponds with a signal value and the horizontal axis 502 corresponds with a normalized depth value. The densitometry plot 500 includes a first densitometric signal 510, second densitometric signal 520, third densitometric signal 530, fourth densitometric signal 540, and fifth densitometric signal 550. Each of the five downhole densitometry signals include 128 points. A system can use signals such as the densitometric signals 510, 520, 530, 540, and 550 to train and validate an atom dictionary. In some embodiments, a downhole computer can select a subset of atoms from the atom dictionary to reconstruct measurements based on data points provided by downhole sensors.

The system can approximate the individual measurements into a characterizing set comprising the coordinates and parameters of the selected atoms. In some embodiments, the selected atoms can include atoms corresponding to each of the densitometric signals 510, 520, 530, 540, and 550. A characterizing set including one or more identifiers can be sent to the surface for reconstruction. Sending such the characterizing set can use fewer bits compared to sending all 128 points of each signal over a measurement period.

Figure 6:
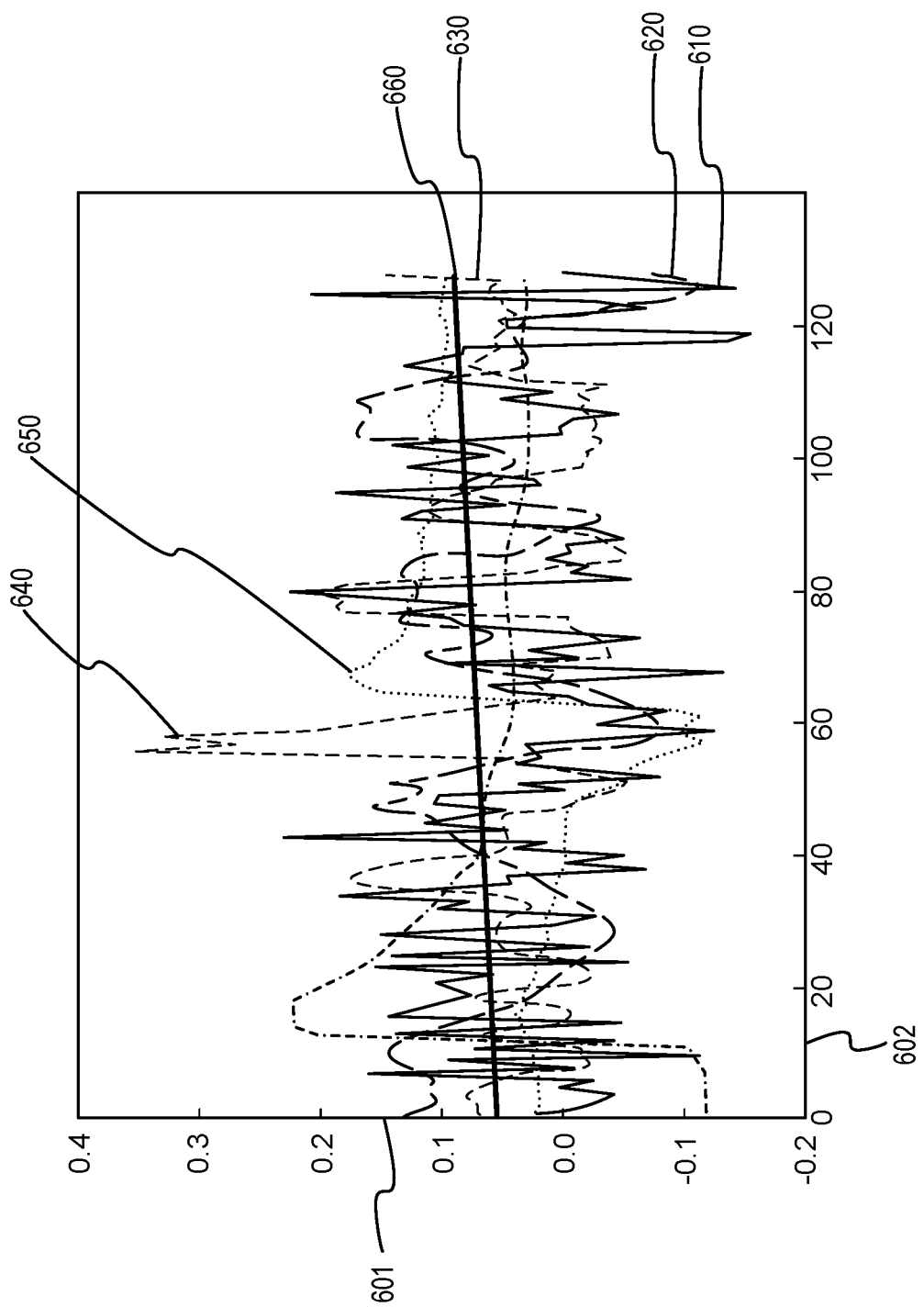
FIG. 6 depicts an example set of atoms including an independently-determined atom.

FIG. 6 depicts an example set of atoms including an independently-determined atom. The atom plot 600 has a vertical axis 601 and a horizontal axis 602. The vertical axis 601 corresponds with a normalized signal value and the horizontal axis 602 corresponds with a normalized depth value. The atom plot 600 includes a first atom signal 610, second atom signal 620, third atom signal 630, fourth atom signal 640, fifth atom signal 650, and sixth atom signal 660. Each of the five atom signals 610, 620, 630, 640 and 650 can be an atom of a dictionary comprising 2048 atoms and can be generated from system training designed to maximize the performance from linear combinations of the atoms, wherein maximizing the performance is based on at least one of a bit number threshold and a reconstruction accuracy threshold. In addition, the sixth atom signal 660 can be added after comparison of the first atom dictionary with an independently-determined set of atoms.

The system can approximate the individual measurements into a characterizing set comprising the coordinates and parameters of the selected atoms. In some embodiments, the selected atoms can include atoms corresponding to each of the atom signals 610, 620, 630, 640, 650 and 660. Using a dictionary including that includes an atom corresponding with the sixth atom signal 660, which is an independently-determined atom signal, can provide a system that is more accurate than a dictionary that does not include an atom corresponding with the sixth atom signal 660.

Figure 7:
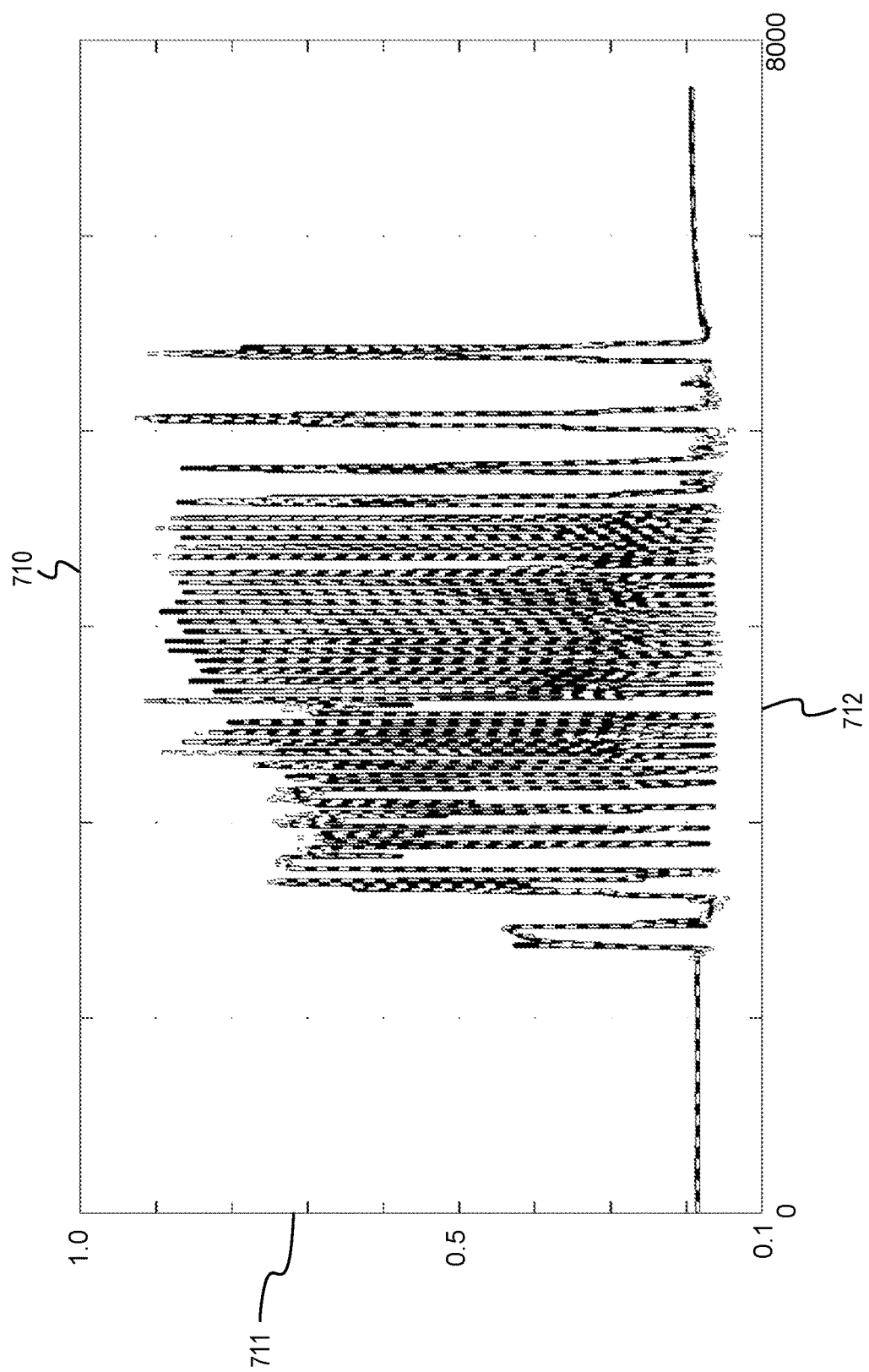
FIG. 7 depicts an example measurement series.

FIG. 7 depicts an example measurement series. A density measurement series plot 710 represents example subsurface measurement series from a subsurface sensor that is measuring density over time. The vertical axis 711 of the density measurement series plot 710 represents density values. The horizontal axis 712 of the density measurement series plot 710 represents times of measurement.

Figure 8:
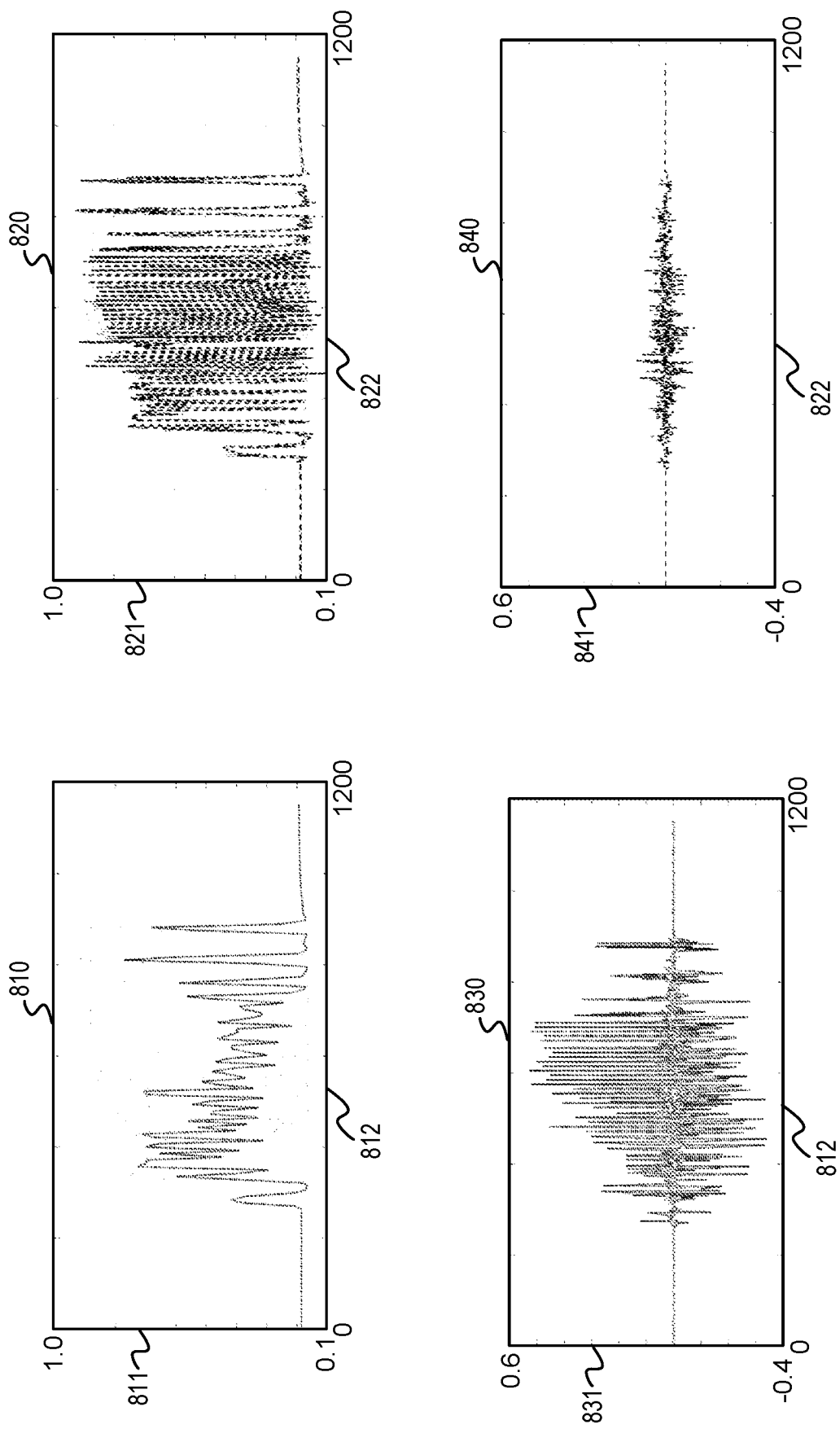
FIG. 8 depicts an example comparison of a reconstructed measurement series based on actual measurements transmitted at a maximum bit rate and a reconstructed measurement series based on an augmented atom dictionary.

FIG. 8 depicts an example comparison of a reconstructed measurement series based on actual measurements transmitted at a maximum bit rate and a reconstructed measurement series based on an augmented atom dictionary. An unaugmented reconstructed density time series plot 810 represents an example unaugmented reconstructed measurement series. The vertical axis 811 of the unaugmented reconstructed density time series plot 810 represents density values. The horizontal axis 812 of the unaugmented reconstructed density time series plot 810 represents times of measurement. With reference to FIG. 7, the system can generate an unaugmented characterizing set based on every tenth point of the measurement series (selected to satisfy a maximum bit rate) represented by the density measurement series plot 710. The system can then communicate the unaugmented characterizing set to the reconstruction processor via fluid pulse telemetry. The reconstruction processor can generate an unaugmented reconstructed measurement series represented by the unaugmented reconstructed density time series plot 810. In addition, the error difference between the unaugmented reconstructed density time series plot 810 is represented by the unaugmented error series plot 830, wherein the vertical axis 831 represents an error difference value between measurements shown in the density measurement series plot 710 of FIG. 7 and the unaugmented reconstructed density time series plot 810. As shown in the unaugmented error series plot 830, the error difference values corresponding to the reconstructed density time series plot 810 is significant and can exceed 0.5.

In contrast, with reference to FIG. 4 and FIG. 7 above, a system can use the measurement series represented by the density measurement series plot 710 to generate an augmented atom combination and augmented characterizing set using the operations described in the flowchart 400. The system can communicate the augmented characterizing set based on the subsurface measurement series and the augmented atom combination to a reconstruction processor via fluid pulse telemetry. The reconstruction processor can generate an augmented reconstructed atom combination based on the communicated augmented characterizing set and use the augmented reconstructed atom combination to generate a reconstructed measurement series represented by an augmented reconstructed density time series plot 820. The vertical axis 821 of the augmented reconstructed density time series plot 820 represents reconstructed normalized density values. The horizontal axis 822 of the augmented reconstructed density time series plot 820 represents simulated times of measurement. By using the characterizing set generated from atoms in an augmented dictionary, the system can provide the reconstructed measurement series shown in the augmented reconstructed density time series plot 820, which is more accurate than the reconstructed time series shown in the unaugmented reconstructed density time series plot 810. Using the data of the augmented reconstructed density time series plot 820, the system can determine various fluid properties such as an average fluid density, fluid composition, etc. In addition, the error difference between the augmented reconstructed density time series plot 820 is represented by the augmented error series plot 840, wherein the vertical axis 841 represents an error difference value between measurements shown in the density measurement series plot 710 of FIG. 7 and the augmented reconstructed density time series plot 820. As shown in the augmented error series plot 840, the error difference values corresponding to the augmented reconstructed density time series plot 820 do not exceed 0.3 and are significantly less than the error difference values shown in the unaugmented error series plot 830.

Example Computer Device

Figure 9:
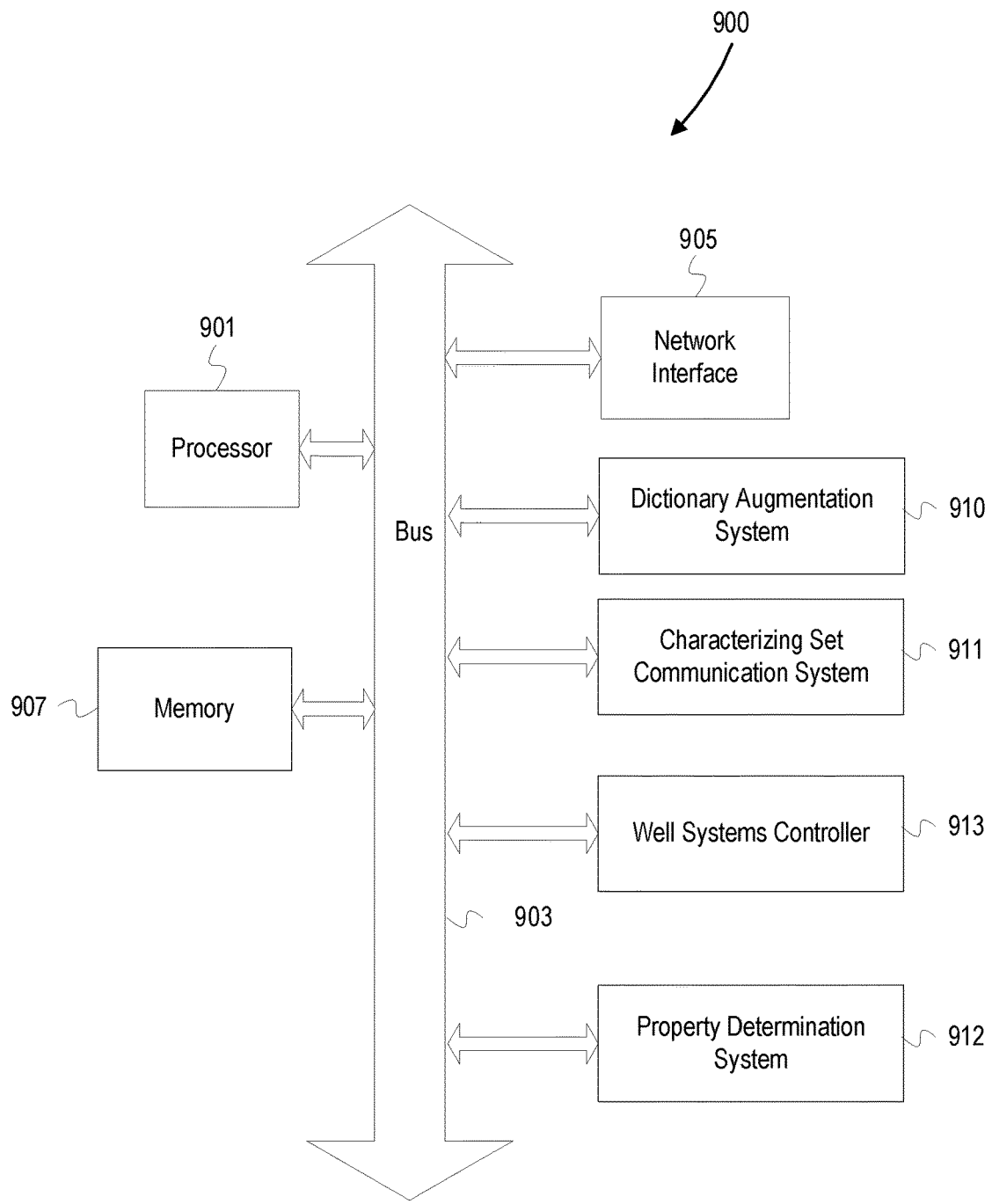
FIG. 9 depicts an example computer device.

FIG. 9 depicts an example computer device. A computer device 900 includes a processor 901 (possibly including multiple processors, multiple cores, multiple nodes, and/or implementing multi-threading, etc.). The computer device 900 includes a memory 907. The memory 907 can be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The memory 907 can be used as a buffer. The computer device 900 also includes a bus 903 (e.g., PCI, ISA, PCI-Express, HyperTransport® bus, InfiniBand® bus, NuBus, etc.) and a network interface 905 (e.g., a Fiber Channel interface, an Ethernet interface, an internet small computer system interface, SONET interface, wireless interface, etc.).

In some embodiments, the computer device 900 includes a dictionary augmentation system 910, a characterizing set communication system 911, property determination system 912, and well system controller 913. The dictionary augmentation system 910 can perform one or more operations for augmenting a dictionary, including adding independently-determined atoms to an atom dictionary, removing atoms from an atom dictionary, etc. The characterizing set communication system 911 can perform one or more operations for communicating a characterizing set, including generating an atom combination, determining residual characteristics and/or determining paradigm parameters. The property determination system 912 can perform one or more operations for determining a formation/fluid property or well status, including reconstructing an atom combination, reconstructing measurements, and/or determining formation/fluid parameters. The well system controller 913 can also perform one or more operations for controlling a drilling system, well treatment system, or wireline system. For example, the well system controller 913 can modify the direction of drill bit, modify the speed of a wireline tool being lowered into a borehole, or change the pump rate of a fluid into a borehole. Any one of the previously described functionalities can be partially (or entirely) implemented in hardware and/or on the processor 901. For example, the functionality can be implemented with an application specific integrated circuit, in logic implemented in the processor 901, in a co-processor on a peripheral device or card, etc. Further, realizations can include fewer or additional components not illustrated in FIG. 9 (e.g., video cards, audio cards, additional network interfaces, peripheral devices, etc.). The processor 901 and the network interface 905 are coupled to the bus 903. Although illustrated as being coupled to the bus 903, the memory 907 can be coupled to the processor 901. The computer device 900 can be integrated into component(s) of the drill pipe downhole and/or be a separate device at the surface that is communicatively coupled to the BHA downhole for controlling and processing signals (as described herein). The computer device 900 can duplicated and positioned at one or more positions in a borehole, at the surface of the borehole, and/or at a remote location. In some embodiments, a computer device similar to the computer device 900 can be used without one or more of the dictionary augmentation system 910, the characterizing set communication system 911, the property determination system 912, and/or the well system controller 913 to perform a subset of the operations described above.

As will be appreciated, aspects of the disclosure can be embodied as a system, method or program code/instructions stored in one or more machine-readable media. Accordingly, aspects can take the form of hardware, software (including firmware, resident software, micro-code, etc.), or a combination of software and hardware aspects that can all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine-readable medium(s) can be utilized. The machine-readable medium can be a machine-readable signal medium or a machine-readable storage medium. A machine-readable storage medium can be, for example, but not limited to, a system, apparatus, or device, that employs any one of or combination of electronic, magnetic, optical, electromagnetic, infrared, or semiconductor technology to store program code. More specific examples (a non-exhaustive list) of the machine-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium can be any tangible medium that can contain, or store a program for use by or in connection with an instruction execution system, apparatus, or device. A machine-readable storage medium is not a machine-readable signal medium.

A machine-readable signal medium can include a propagated data signal with machine readable program code embodied therein, for example, in baseband or as part of a carrier wave. Such a propagated signal can take any of a variety of forms, including, but not limited to, electromagnetic, optical, or any suitable combination thereof. A machine-readable signal medium can be any machine readable medium that is not a machine-readable storage medium and that can communicate, propagate, or transport a program for use by or in connection with an instruction execution system, apparatus, or device.

Program code embodied on a machine-readable medium can be transmitted using any appropriate medium, including but not limited to wireless, wireline, optical fiber cable, RF, etc., or any suitable combination of the foregoing.

Computer program code for carrying out operations for aspects of the disclosure can be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code can execute entirely on a stand-alone machine, can execute in a distributed manner across multiple machines, and can execute on one machine while providing results and or accepting input on another machine.

The program code/instructions can also be stored in a machine-readable medium that can direct a machine to function in a particular manner, such that the instructions stored in the machine-readable medium produce an article of manufacture including instructions which implement the function/act specified in the flowchart and/or block diagram block or blocks.

Additional Terminology and Variations

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed. Use of the term "set" can be treated as meaning "group having at least one of" For example, "set of items" can be treated as meaning "group of items having at least one item." A bit rate is a transfer rate of data in bits per unit of time. A formation property is a measurable property of the formation such as formation density, amount of hydrocarbons in the formation, formation porosity, formation permeability, etc. A fluid property is a measurable property of a fluid such as fluid pressure, fluid temperature, fluid composition, fluid concentration, etc.

Example Embodiments

Example embodiments include the following:

Embodiment 1: An apparatus comprising: a subsurface sensor for use in a borehole to provide a subsurface measurement series; a subsurface processor to receive the subsurface measurement series; and a machine-readable medium having a program code to cause the apparatus to, obtain the subsurface measurement series, generate an atom combination based on the subsurface measurement series using the subsurface processor, wherein the atom combination comprises a subset of atoms from a dictionary, generate a set of characterizing values using the subsurface processor, wherein the set of characterizing values comprises an atom identifier and at least one corresponding atom weight for at least one atom from the atom combination, and transmit the set of characterizing values to a different physical location.

Embodiment 2: The apparatus of Embodiment 1, wherein the dictionary is a first dictionary, and the program code further comprises instructions to select the first dictionary from a set of dictionaries based on at least one of a reconstruction accuracy threshold and a first bit number threshold.

Embodiment 3: The apparatus of Embodiments 1 or 2, wherein the subsurface measurement series is a first subsurface measurement series, and wherein the program code further comprises instructions to: determine a first offset pattern and a corresponding first offset pattern parameter of the first offset pattern, wherein a difference between the first subsurface measurement series and the corresponding first offset pattern parameter satisfies a constraint condition; obtain a second subsurface measurement series using the subsurface sensor; and determine a second offset pattern and a corresponding second offset pattern parameter of the second offset pattern, wherein a difference between the second subsurface measurement series and the corresponding second offset pattern parameter satisfies the constraint condition.

Embodiment 4: The apparatus of any of Embodiments 1-3, further comprising program code to set a first bit number to be greater than a second bit number, wherein the first bit number is equal to a first count of bits used to transmit a first value and the second bit number is equal to a second count of bits used to transmit a second value, and wherein the set of characterizing values comprises the first value and the second value.

Embodiment 5: The apparatus of any of Embodiments 1-4, wherein the program code further comprises instructions to: determine whether a bit number total associated with the atom combination is greater than a maximum bit number threshold; and in response to the bit number total being greater than the maximum bit number threshold, store a second characterizing value in a buffer.

Embodiment 6: The apparatus of any of Embodiments 1-5, wherein the atom combination comprises a second atom, and wherein the second characterizing value represents at least one of an atom identifier corresponding to the second atom and an atom weight corresponding to the second atom.

Embodiment 7: The apparatus of any of Embodiments 1-6, wherein the set of characterizing values is a first set of characterizing values, and wherein the program code further comprises instructions to transmit a second set of characterizing values to the different physical location at a time after transmitting the first set of characterizing values, and wherein the second set of characterizing values comprises the second characterizing value in the buffer.

Embodiment 8: The apparatus of any of Embodiments 1-7, wherein the program code to store the second characterizing value in the buffer further comprises instructions to: in response to the bit number total being greater than the maximum bit number threshold, generate an initial reconstructed measurement series, wherein the initial reconstructed measurement series is based on a first subset of atoms from the atom combination; determine a residue based on a difference between the initial reconstructed measurement series and the subsurface measurement series; and generate a set of residue-reconstructing atoms based on the residue, wherein the second characterizing value is associated with an atom from the set of residue-reconstructing atoms in the buffer.

Embodiment 9: A method for transmitting information through a borehole, the method comprising: obtaining subsurface measurement series using a subsurface sensor in the borehole; generating an atom combination based on the subsurface measurement series using a subsurface processor, wherein the atom combination comprises a subset of atoms from a dictionary; generating a set of characterizing values using the subsurface processor, wherein the set of characterizing values comprises an atom identifier and at least one corresponding atom weight for at least one atom from the atom combination; and transmitting the set of characterizing values to a different physical location.

Embodiment 10: The method of Embodiment 9, wherein the dictionary is a first dictionary, and wherein the method further comprises selecting the first dictionary from a set of dictionaries based on at least one of a reconstruction accuracy threshold and a first bit number threshold.

Embodiment 11: The method of Embodiments 9 or 10, wherein the subsurface measurement series is a first subsurface measurement series, and wherein the method further comprises: determining a first offset pattern and a corresponding first offset pattern parameter of the first offset pattern, wherein a difference between the first subsurface measurement series and the corresponding first offset pattern parameter satisfies a constraint condition; obtaining a second subsurface measurement series using the subsurface sensor; and determining a second offset pattern and a corresponding second offset pattern parameter of the second offset pattern, wherein a difference between the second subsurface measurement series and the corresponding second offset pattern parameter satisfies the constraint condition.

Embodiment 12: The method of any of Embodiments 9-11, further comprising setting a first bit number to be greater than a second bit number, wherein the first bit number is equal to a first count of bits used to transmit a first value and the second bit number is equal to a second count of bits used to transmit a second value, and wherein the set of characterizing values comprises the first value and the second value.

Embodiment 13: The method of any of Embodiments 9-12, further comprising: determining whether a bit number total associated with the atom combination is greater than a maximum bit number threshold; and in response to the bit number total being greater than the maximum bit number threshold, storing a second characterizing value in a buffer.

Embodiment 14: The method of any of Embodiments 9-13, wherein the second characterizing value corresponds to a second atom in the atom combination, and wherein the second characterizing value is at least one of a second atom identifier and a second atom weight.

Embodiment 15: The method of any of Embodiments 9-14, wherein the set of characterizing values is a first set of characterizing values, and wherein the method further comprises transmitting a second set of characterizing values to the different physical location at a time after transmitting the first set of characterizing values, and wherein the second set of characterizing values comprises the second characterizing value in the buffer.

Embodiment 16: The method of any of Embodiments 9-15, wherein storing the second characterizing value in the buffer comprises: in response to the bit number total being greater than the maximum bit number threshold, generating an initial reconstructed measurement series, wherein the initial reconstructed measurement series is based on a first subset of atoms from the atom combination; determining a residue based on a difference between the initial reconstructed measurement series and the subsurface measurement series; and generating a set of residue-reconstructing atoms based on the residue, wherein the second characterizing value is associated with an atom from the set of residue-reconstructing atoms in the buffer.

Embodiment 17: One or more non-transitory machine-readable media comprising program code for transmitting information through a borehole, the program code to: obtain subsurface measurement series using a subsurface sensor in the borehole; generate an atom combination based on the subsurface measurement series using a subsurface processor, wherein the atom combination comprises a subset of atoms from a dictionary; generate a set of characterizing values using the subsurface processor, wherein the set of characterizing values comprises an atom identifier and at least one corresponding atom weight for at least one atom from the atom combination; and transmit the set of characterizing values to a different physical location.

Embodiment 18: The one or more non-transitory machine-readable media of Embodiment 17, wherein the dictionary is a first dictionary, and wherein the non-transitory machine-readable media further comprises program code to select the first dictionary from a set of dictionaries based on at least one of a reconstruction accuracy threshold and a first bit number threshold.

Embodiment 19: The one or more non-transitory machine-readable media of Embodiments 17 or 18, further comprising program code to set a first bit number to be greater than a second bit number, wherein the first bit number is equal to a first count of bits used to transmit a first value and the second bit number is equal to a second count of bits used to transmit a second value, and wherein the set of characterizing values comprises the first value and the second value.

Embodiment 20: The one or more non-transitory machine-readable media of any of Embodiments 17-19, further comprising program code to: determine whether a bit number total associated with the atom combination is greater than a maximum bit number threshold; and in response to the bit number total being greater than the maximum bit number threshold, store a second characterizing value in a buffer.

What is claimed is:

1. An apparatus comprising:
a subsurface sensor for use in a borehole to provide a subsurface measurement series;
a subsurface processor to receive the subsurface measurement series; and
a machine-readable medium having a program code to cause the apparatus to,
obtain the subsurface measurement series,
generate an atom combination based on the subsurface measurement series using the subsurface processor, wherein the atom combination comprises a subset of atoms selected from an augmented dictionary that does not include a least used set of atoms;
generate a set of characterizing values using the subsurface processor, wherein the set of characterizing values comprises an atom identifier and at least one corresponding atom weight for at least one atom from the subset of atoms, and
transmit the set of characterizing values to a different physical location.

2. The apparatus of claim 1, wherein the augmented dictionary is a first dictionary, and the program code further comprises instructions to select the first dictionary from a set of dictionaries based on at least one of a reconstruction accuracy threshold and a first bit number threshold.

3. The apparatus of claim 1, wherein the subsurface measurement series is a first subsurface measurement series, and wherein the program code further comprises instructions to:
determine a first offset pattern and a corresponding first offset pattern parameter of the first offset pattern, wherein a difference between the first subsurface measurement series and the corresponding first offset pattern parameter satisfies a constraint condition;
obtain a second subsurface measurement series using the subsurface sensor; and
determine a second offset pattern and a corresponding second offset pattern parameter of the second offset pattern, wherein a difference between the second subsurface measurement series and the corresponding second offset pattern parameter satisfies the constraint condition.

4. The apparatus of claim 1, further comprising program code to set a first bit number to be greater than a second bit number, wherein the first bit number is equal to a first count of bits used to transmit a first value and the second bit number is equal to a second count of bits used to transmit a second value, and wherein the set of characterizing values comprises the first value and the second value.

5. The apparatus of claim 1, wherein the program code further comprises instructions to:
   determine whether a bit number total associated with the atom combination is greater than a maximum bit number threshold; and
   in response to the bit number total being greater than the maximum bit number threshold, store a second characterizing value in a buffer.

6. The apparatus of claim 5, wherein the atom combination comprises a second atom, and wherein the second characterizing value represents at least one of an atom identifier corresponding to the second atom and an atom weight corresponding to the second atom.

7. The apparatus of claim 5, wherein the set of characterizing values is a first set of characterizing values, and wherein the program code further comprises instructions to transmit a second set of characterizing values to the different physical location at a time after transmitting the first set of characterizing values, and wherein the second set of characterizing values comprises the second characterizing value in the buffer.

8. The apparatus of claim 5, wherein the program code to store the second characterizing value in the buffer further comprises instructions to:
   in response to the bit number total being greater than the maximum bit number threshold, generate an initial reconstructed measurement series, wherein the initial reconstructed measurement series is based on a first subset of atoms from the atom combination;
   determine a residue based on a difference between the initial reconstructed measurement series and the subsurface measurement series; and
   generate a set of residue-reconstructing atoms based on the residue, wherein the second characterizing value is associated with an atom from the set of residue-reconstructing atoms in the buffer.

9. A method for transmitting information through a borehole, the method comprising:
   obtaining subsurface measurement series using a subsurface sensor in the borehole;
   generating an atom combination based on the subsurface measurement series using a subsurface processor, wherein the atom combination comprises a subset of atoms selected from an augmented dictionary that does not include a least used set of atoms;
   generating a set of characterizing values using the subsurface processor, wherein the set of characterizing values comprises an atom identifier and at least one corresponding atom weight for at least one atom from the subset of atoms; and
   transmitting the set of characterizing values to a different physical location.

10. The method of claim 9, wherein the augmented dictionary is a first dictionary, and wherein the method further comprises selecting the first dictionary from a set of dictionaries based on at least one of a reconstruction accuracy threshold and a first bit number threshold.

11. The method of claim 9, wherein the subsurface measurement series is a first subsurface measurement series, and wherein the method further comprises:
   determining a first offset pattern and a corresponding first offset pattern parameter of the first offset pattern, wherein a difference between the first subsurface measurement series and the corresponding first offset pattern parameter satisfies a constraint condition;
   obtaining a second subsurface measurement series using the subsurface sensor; and
   determining a second offset pattern and a corresponding second offset pattern parameter of the second offset pattern, wherein a difference between the second subsurface measurement series and the corresponding second offset pattern parameter satisfies the constraint condition.

12. The method of claim 9, further comprising setting a first bit number to be greater than a second bit number, wherein the first bit number is equal to a first count of bits used to transmit a first value and the second bit number is equal to a second count of bits used to transmit a second value, and wherein the set of characterizing values comprises the first value and the second value.

13. The method of claim 9, further comprising:
   determining whether a bit number total associated with the atom combination is greater than a maximum bit number threshold; and
   in response to the bit number total being greater than the maximum bit number threshold, storing a second characterizing value in a buffer.

14. The method of claim 13, wherein the second characterizing value corresponds to a second atom in the atom combination, and wherein the second characterizing value is at least one of a second atom identifier and a second atom weight.

15. The method of claim 13, wherein the set of characterizing values is a first set of characterizing values, and wherein the method further comprises transmitting a second set of characterizing values to the different physical location at a time after transmitting the first set of characterizing values, and wherein the second set of characterizing values comprises the second characterizing value in the buffer.

16. The method of claim 13, wherein storing the second characterizing value in the buffer comprises:
   in response to the bit number total being greater than the maximum bit number threshold, generating an initial reconstructed measurement series, wherein the initial reconstructed measurement series is based on a first subset of atoms from the atom combination;
   determining a residue based on a difference between the initial reconstructed measurement series and the subsurface measurement series; and
   generating a set of residue-reconstructing atoms based on the residue, wherein the second characterizing value is associated with an atom from the set of residue-reconstructing atoms in the buffer.

17. One or more non-transitory machine-readable media comprising program code for transmitting information through a borehole, the program code to:
   obtain subsurface measurement series using a subsurface sensor in the borehole;
   generate an atom combination based on the subsurface measurement series using a subsurface processor, wherein the atom combination comprises a subset of atoms selected from an augmented dictionary that does not include a least used set of atoms;
   generate a set of characterizing values using the subsurface processor, wherein the set of characterizing values comprises an atom identifier and at least one corresponding atom weight for at least one atom from the subset of atoms; and
   transmit the set of characterizing values to a different physical location.

18. The one or more non-transitory machine-readable media of claim 17, wherein the augmented dictionary is a first dictionary, and wherein the one or more non-transitory machine-readable media further comprises program code to select the first dictionary from a set of dictionaries based on at least one of a reconstruction accuracy threshold and a first bit number threshold.

19. The one or more non-transitory machine-readable media of claim 17, further comprising program code to set a first bit number to be greater than a second bit number, wherein the first bit number is equal to a first count of bits used to transmit a first value and the second bit number is equal to a second count of bits used to transmit a second value, and wherein the set of characterizing values comprises the first value and the second value.

20. The one or more non-transitory machine-readable media of claim 17, further comprising program code to:
 determine whether a bit number total associated with the atom combination is greater than a maximum bit number threshold; and
 in response to the bit number total being greater than the maximum bit number threshold, store a second characterizing value in a buffer.

* * * * *